United States Patent

Hayashi et al.

[11] Patent Number: 5,221,906
[45] Date of Patent: Jun. 22, 1993

[54] PROGRAM CONTROL DIGITAL PULSE GENERATOR

[75] Inventors: Kazuo Hayashi; Yukihisa Naoe, both of Hyogo, Japan

[73] Assignee: Mitsubishi Denki Kabushiki Kaisha, Japan

[21] Appl. No.: 755,378

[22] Filed: Sep. 5, 1991

[30] Foreign Application Priority Data

Oct. 30, 1990 [JP] Japan .................. 2-293287

[51] Int. Cl.[5] .................. H03K 5/15; H03K 21/08
[52] U.S. Cl. .................. 328/62; 377/39; 377/54; 377/56; 328/61; 328/119
[58] Field of Search .................. 328/60, 61, 62, 119; 377/39, 54, 55, 56

[56] References Cited

U.S. PATENT DOCUMENTS

| | | | |
|---|---|---|---|
| 3,657,658 | 4/1972 | Kubo | 328/61 |
| 3,937,932 | 2/1976 | Ahlgren | 377/39 |
| 4,191,998 | 3/1980 | Carmody | 328/62 |
| 4,326,247 | 4/1982 | Chamberlin | 364/200 |
| 4,700,367 | 10/1987 | Kawazue et al. | 377/39 |
| 4,756,013 | 7/1988 | Van Veldhuizen | 377/39 |
| 4,805,199 | 2/1989 | Muramatsu | 377/39 |
| 4,809,221 | 2/1989 | Magliocco et al. | 395/550 |
| 4,855,681 | 8/1989 | Millham | 328/62 |
| 5,060,244 | 10/1991 | Robertson | 377/54 |
| 5,087,829 | 2/1992 | Ishibashi et al. | 328/62 |

Primary Examiner—John S. Heyman
Attorney, Agent, or Firm—Townsend and Townsend Khourie and Crew

[57] ABSTRACT

A pulse generating circuit equipped with a data register (17) in which there are stored data to designate output terminals (14a to 14m) which generate output pulses and data to define the output states of the output terminals (14a to 14m). Also included in the pulse generating circuit is a decoder (16) for decoding the contents of the data register (17) to output the decoding result to a port latch (15) having the output terminals (14a to 14m), so that one selected from the output terminals (14a to 14m) generates the output pulse.

3 Claims, 7 Drawing Sheets

| $t_0$ | $t_1$ | $t_2$ | $t_3$ | $t_4$ | $t_5$ | - - - |
|---|---|---|---|---|---|---|
| 14m | 14m | 14m | 14λ | 14λ | | |
| 0 | 1 | 0 | 1 | 0 | | |
| | $M_1$ | $M_2$ | $M_3$ | $M_4$ | | |

PROGRAM CONTROL DIGITAL PULSE GENERATOR

BACKGROUND OF THE INVENTION

1. Field of the Invention

The present invention relates generally to pulse generating circuits, and more particularly to such a pulse generating circuit incorporated into a microcomputer system so as to generate a pulse as an output signal of the system.

2. Description of the Prior Art

FIG. 8 is a block diagram showing an arrangement of a conventional pulse generating circuit such as disclosed in U.S. Pat. No. 4,805,199. In the illustration, numeral 1 represents a CPU, 2 designates a counter, 3 depicts a data bus, 4 denotes a clock generating circuit, 5 indicates a clock signal to be outputted from the clock generating circuit 4, and 6 is a comparison value register. Further, numeral 7 represents a digital comparator one input terminal of which is coupled to the counter 2 and the other input terminal of which is coupled to the comparison value register 6, 8 designates a counter buffer coupled to the counter 2, 8G depicts a gate for reloading the value of the counter buffer 8 to the counter 2 in accordance with an overflow signal of the counter 2, 9 denotes a clock switching circuit for performing a switching operation between an internal clock signal and an external clock signal, and 10 is a prescaler the input terminal of which is coupled to the clock switching circuit 9 and the output terminal of which is coupled to the counter 2. Still further, numeral 11 represents an external clock terminal coupled to one input terminal of the clock switching circuit 9, 12 designates a register buffer coupled to the comparison value register 6, 12G depicts a gate for loading the value of the register buffer 12 to the comparison value register 6 in accordance with the output signal of the digital comparator 7, 13 is a shift register where the internal data are shifted in accordance with the output signal of the digital comparator 7, and 14 denotes an output terminal coupled to the shift register 13.

Secondly, operation will be described hereinbelow with reference to FIG. 9. First, an initial value $N_1$ is set to the counter 2, a reload value $N_2$ to be reloaded by the overflow of the counter 2 is set to the counter buffer 8, time data $M_1 (>N_1)$ for outputting one edge of a pulse are written into the comparison value register 6, time data $M_2 (>M_1)$ for outputting the other edge of the output pulse are written into the register buffer 12, and data for the output pulse train are written into the shift register 13. Here, let it be assumed that the initial value of pulse output terminal 14 is taken to be "0".

As illustrated in FIG. 9, the counter 2 counts the clock input, divided by the prescaler 10, from the initial value $N_1$ (time to). In response to the value of the counter 2 becoming equal to the value $M_1$ of the comparison value register 6 at the time $t_1$, the digital comparator 7 detects the coincidence therebetween to output a coincidence pulse, whereby the data of the shift register 13 is shifted by one bit. If "1" is set as the most significant bit after the shifting, "1" is outputted to the pulse output terminal 14. Further, at the same time, the coincidence pulse causes the data $M_2$ within the register buffer 12 to be loaded in the comparison value register 6.

When due to the continuous counting operation of the counter 2 the counter value becomes equal to the value $M_2$ of the comparison value register 6 at the time $t_2$, the digital comparator 7 detects the coincidence therebetween so as to output a coincidence pulse, whereby the data of the shift register 13 is shifted by one bit. If the most significant bit after the shifting is "0", "0" is outputted to the pulse output terminal 14.

Further, assuming that due to the continuous counting operation of the counter 2 the overflow occurs at the time $t_4$, the value $N_2$ of the counter buffer 8 is loaded to the counter 2. In the case that values $M_3 (>N_2)$ and $M_4 (>M_3)$ are respectively written newly into the comparison value register 6 and the register buffer 12, pulse outputs appear at the pulse output terminal 14 at the times (times $t_5$ and $t_6$) when the counter values becomes equal to the values $M_3$ and $M_4$, respectively.

However, because of the above-described arrangement, there are problems arising with such a conventional pulse generating circuit in that one pulse generating circuit allows only one pulse output and hence, for outputting pulses to a plurality of output terminals, the circuit size becomes large to enlarge the chip size when incorporating it in an integrated circuit.

SUMMARY OF THE INVENTION

The present invention has been developed in order to eliminate the aforementioned problems and contemplates to provide a pulse generating circuit which is capable of outputting pulses to a plurality of output terminals.

According to this invention a pulse generating circuit is equipped with a counter 2 arranged to count clocks and to enter into the reset state when reaching a predetermined value, a register 6 for storing comparison data for defining the timing of the pulse generation, and a comparator 7 for detecting the coincidence between the data of the register 6 and the counter 2 so as to output a coincidence signal, the pulse generating circuit is further arranged to comprise a port latch 15 having a plurality of output terminals, a data register 17 for storing data to designate output terminals 14a to 14n to generate output pulses and further for storing data to define the output states of the output terminals 14a to 14n, and a decoding circuit 16 for decoding the contents of the data register 17 to output a decoded signal to the port latch 15 in synchronism with the coincidence signal.

According to the pulse generating circuit of this invention, the decoding circuit 16 decodes the value of the data register 17 set in advance and sets or resets one of the plurality of output terminals 14a to 14m. The setting or resetting timing is adjusted by the initial value of the counter 2 and the set data of the register 6.

The above and other objects, features, and advantages of the invention will become more apparent from the following description when taken in conjunction with the accompanying drawings.

DESCRIPTION OF THE PREFERRED EMBODIMENT

Figure 1:
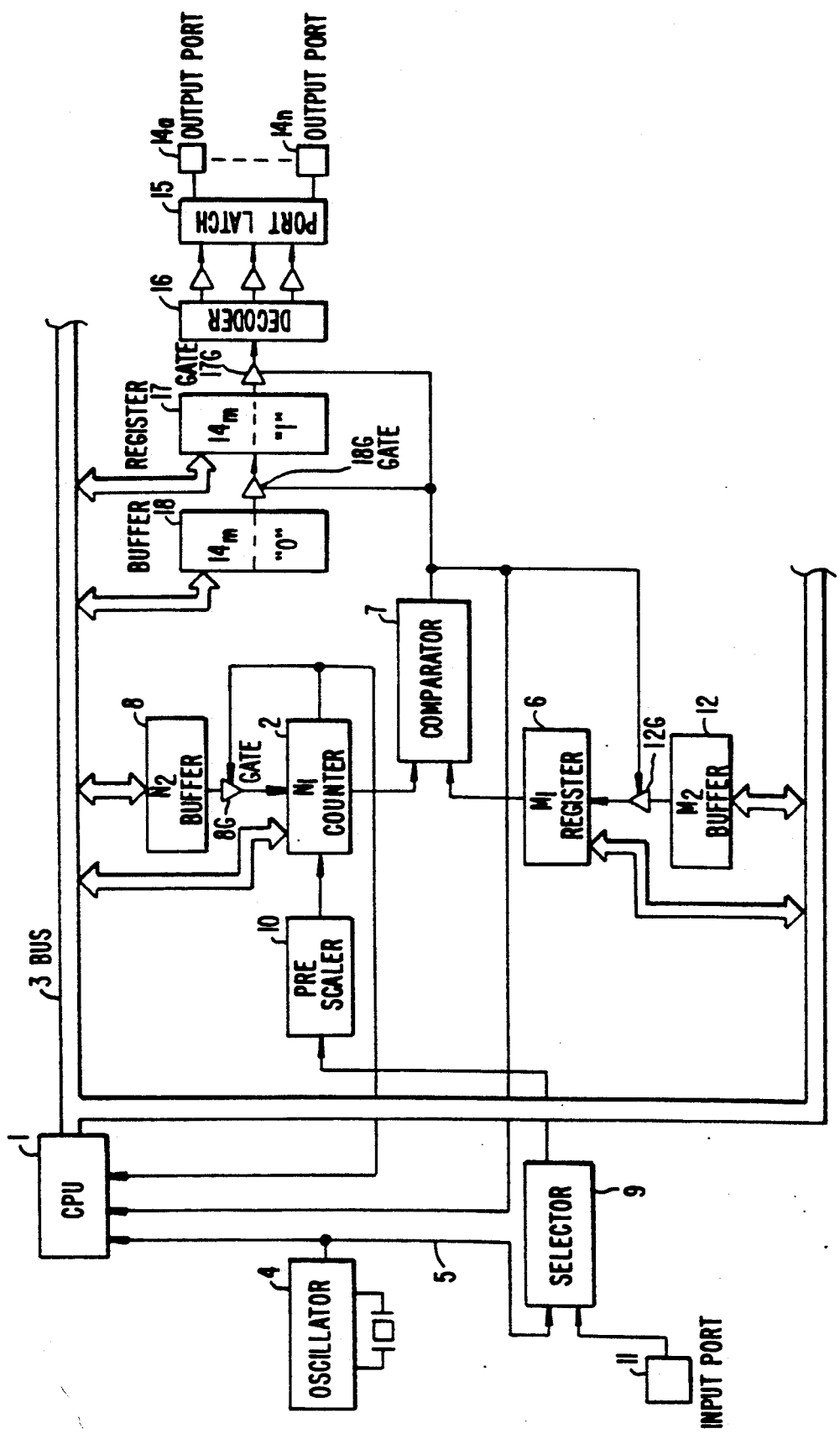
FIG. 1 is a block diagram showing a pulse generating circuit according to an embodiment of the present invention.
Figures 3, 4:
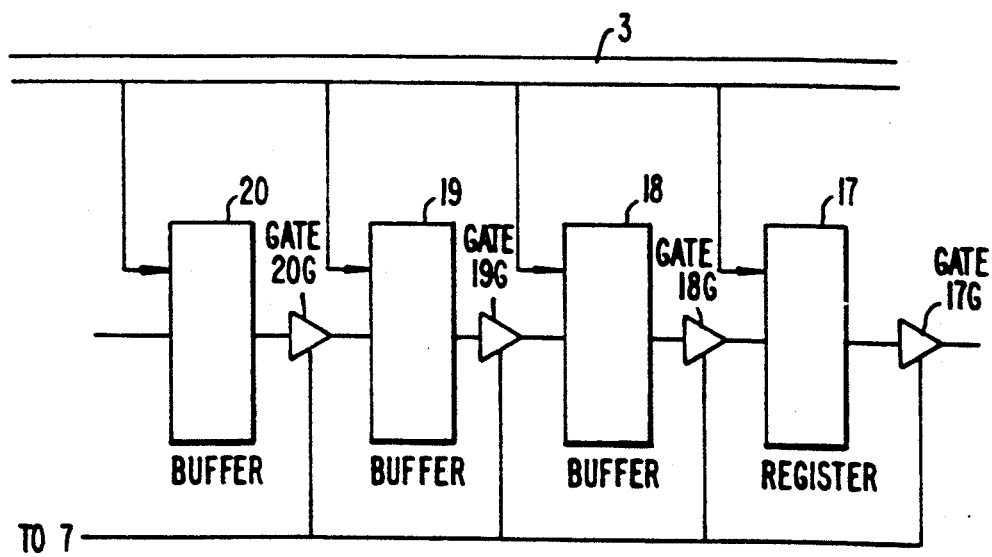
FIG. 3 is an illustration for exemplifying the stored data of a data register and register buffer to be used in a pulse generating circuit of this invention.
FIG. 4 is a circuit diagram showing a portion including a data register and a plurality of register buffers to be used in a pulse generating circuit of this invention.

An embodiment of the present invention will be described hereinbelow with reference to the drawings. In FIG. 1, numeral 1 represents a CPU, 2 is a counter, 3 denotes a data bus, 4 designates a clock generating circuit, 5 depicts a clock signal to be outputted from the clock generating circuit 4, 6 represents a comparison value register, 7 indicates a digital comparator one input terminal of which is coupled to the counter 2 and the other input terminal of which is coupled to the comparison value register 6, 8 denotes a counter buffer coupled to the counter 2, 8G is a gate for reloading the value of the counter buffer 8 to the counter 2 in accordance with an overflow signal of the counter 2, and 9 represents a clock switching circuit for performing a switching operation between the internal clock signal and the external clock signal. Further, numeral 10 represents a prescaler the input terminal of which is coupled to the clock switching circuit 9 and the output terminal of which is coupled to the counter 2, 11 depicts an external clock terminal coupled to one input terminal of the clock switching circuit 9, 12 is a register buffer coupled to the comparison value register 6, 12G designates a gate for loading the value of the register buffer 12 to the comparison value register 6 in accordance with the output signal of the digital comparator 7, 14a to 14m represent plural output terminals, 15 designates a port latch having bits whose number is equal to the number of the output terminals 14a to 14m, and 16 is a decoder whose output terminal is coupled to the port latch 15. Still further, numeral 17 designates a data register coupled to the decoder 16, 17G depicts a gate for outputting the value of the data register 17 to the decoder 16 in accordance with the coincidence pulse, 18 denotes a register buffer coupled to the data register 17, and 18G is a gate for transferring the value of the register buffer 18 to the data register 17. As illustrated in FIG. 3, in the data register 17 and the register buffers 12, 18, one output terminal and "1" or "0" indicating the state thereof are set in advance through the CPU 1.

Figure 2:
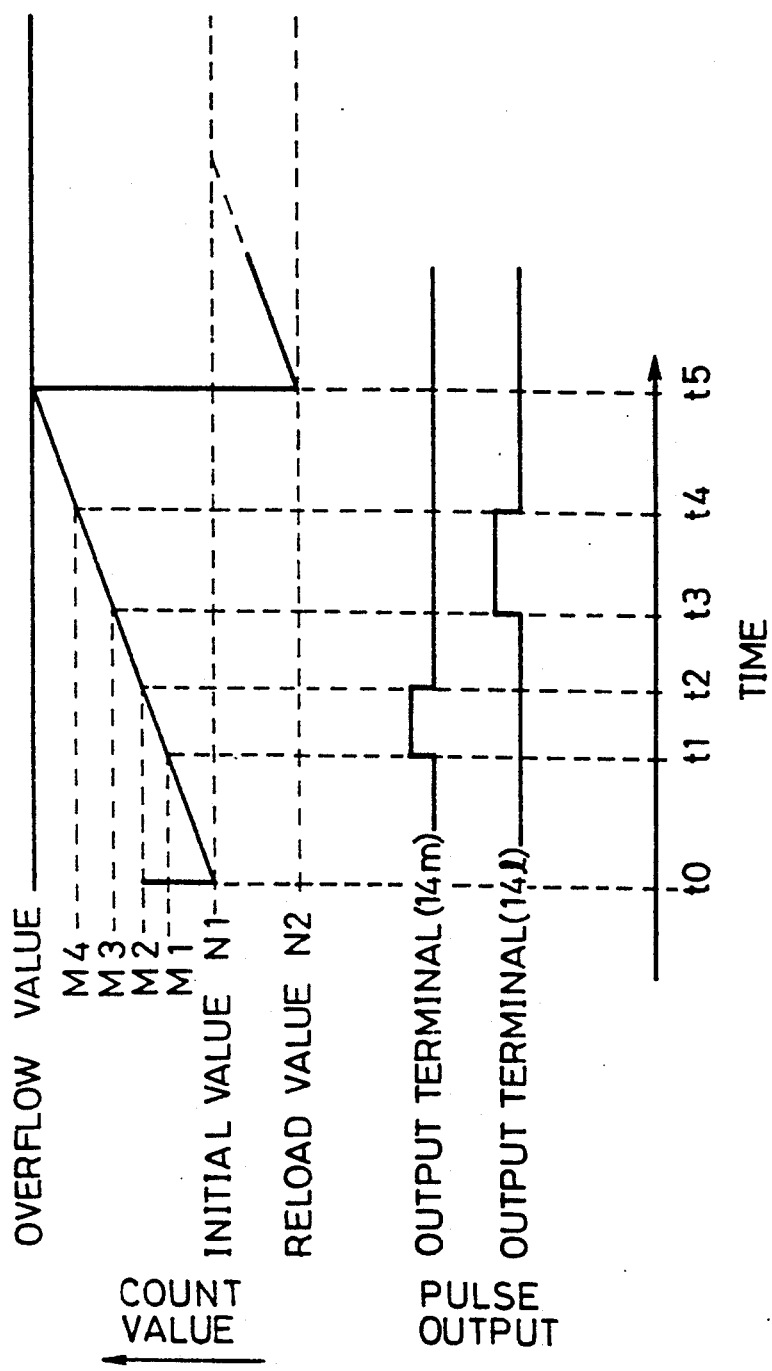
FIG. 2 is a timing chart showing the operation of the embodiment of this invention.

The operation will be described hereinbelow with reference to FIG. 2. First, an initial value $N_1$ is set to the counter 2, a reload value $N_2$ to be reloaded by the overflow of the counter 2 is set to the counter buffer 8, time data $M_1$ ($>N_2$) that one output terminal (for example, the output terminal 14m) first varies is written into the comparison value register 6, time data $M_2$ ($>M_1$) that the same output terminal (14m) secondly varies is written into the register buffer 12, address data for designating the output terminal (14m) and data "1" for designating the variation state of the output terminal (14m) (at the time when the counter value $M_1$) are written into the data register 17, and address data for designating the output terminal (14m) and data "0" for designating the variation state of the output terminal (14m) (at the time when the counter value is $M_2$) are written into the register buffer 18. Here, all of the initial values of the output terminals 14a to 14n are set to "0".

The counter 2, in addition to the initial value $N_1$ (from $t_0$), counts the clock input divided by the prescaler 10. When the value of the counter 2 becomes equal to the value $M_1$ of the comparison value register 6 (at the time $t_1$), the digital comparator 7 detects the coincidence therebetween so as to output a coincidence pulse. In response to this coincidence pulse, the data of the data register 17 is outputted through the gate 17G to the decoder 16. Secondly, the decoder 16 decodes this data and the decoded signal (terminal address and state signal) is transferred to the port latch 15 where the bit state of a specific output terminal varies. Now, since data for setting the output terminal 14m to "1" are stored in the data register 17, "1" is outputted to the output terminal 14m at the time $t_1$. Further, at the same time, in accordance with the coincidence pulse, the data $M_2$ within the register buffer 12 are transferred to the comparison value register 6 and the data within the register buffer 18 are transferred through the gate 18G to the data register 17.

Due to the continuously counting operation of the counter 2, when the counter value becomes equal to the value of the data $M_2$ newly set in the comparison value register 6 at the time $t_2$, the digital comparator 7 detects the coincidence therebetween to output a coincidence pulse. With this coincidence pulse, the data of the data register 17 are outputted through the gate 17G to the decoder 16. The decoder 16 decodes this data and the decoded signal (terminal address and state signal) is transferred to the port latch 15 whereby the bit state of a specific output terminal varies. Now, since the data for setting the output terminal 14m to "0" is stored in the data register 17, the output terminal 14m is changed to "0" at the time $t_2$.

Further, as shown in FIG. 3, under the control of the CPU 1, the time data $M_3$ ($>M_2$) where a given output terminal 141 varies are written into the the comparison value register 6 and the time data $M_4$ ($>M_3$) where the given output terminal 141 varies are written into the register buffer 12. Further under the control of the CPU 1, the address data for designating the output terminal 141 and the data "1" for designating the variation state of the output terminal 141 at the time of the counter value = $M_3$ are written into the data register 17, and the address data for designating the output terminal 141 and the data "0" for designating the variation state of the output terminal 141 at the time of the counter value = $M_4$ are written into the register buffer 18. Assuming that the data of the data register 17 and register buffer 18 are data for respectively setting the output terminal 141 to "1" and "0", when the counter value is $M_3$, "1" is outputted to the output terminal 141, and when the counter value is $M_4$, "0" is outputted thereto.

Due to further counting operation of the counter 2, when the overflow occurs (at the time $t_5$), the value $N_2$ of the counter buffer 8 is loaded to the counter 2.

Figure 5A:
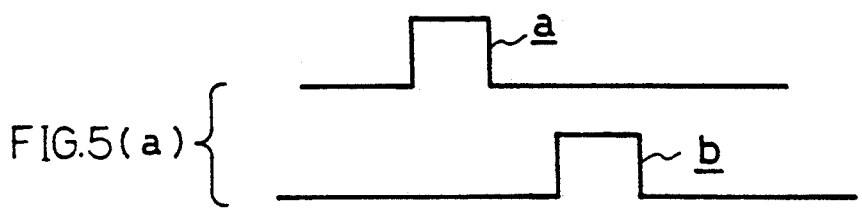
FIGS. 5a-5c are illustrations of the generation state of various pulses to be used in this invention.
Figure 5B:
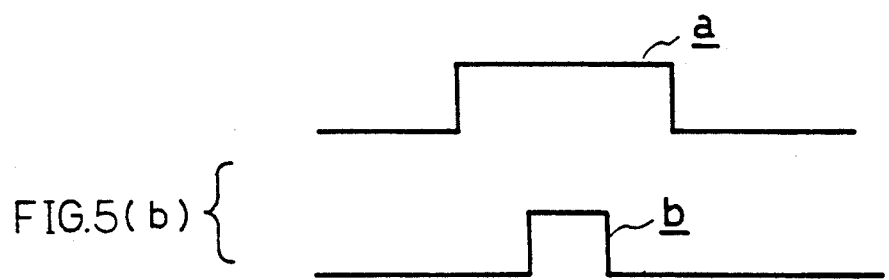
Figure 5C:
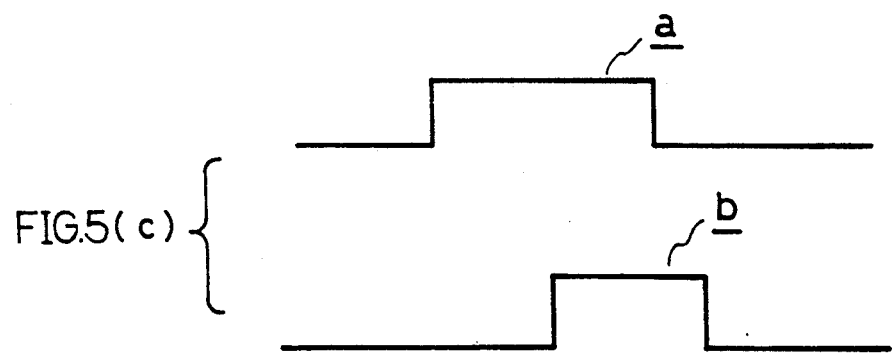

Here, although in the above-described embodiment pulses are outputted to two output terminals, it is appropriate to output pulses to three or more output terminals. Further, although in the above-described embodiment the two pulses are not coincident with each other, it is possible that the two pulses to be outputted are coincident with each other with the values of the data register 17 and the register buffer 18 being taken to be appropriate values (for example, the output terminal 141 is set to "1" with the output terminal 14m being set to be "1"). Further, it is also possible that the data writing by the CPU 1 is performed in advance with a plurality of devices being in series connected to each other as shown in FIG. 4. At this time, as illustrated in FIG. 3, the designated output terminal addresses and the output state data "0" or "1" are in advance stored in the data register 17 and the register buffers 18, 19 and 20. With various combinations of the output terminal addresses and the state data, as shown in FIG. 5(a) time series pulses a and b can be developed at different terminals, as shown in FIG. 5(b) the pulse b can be developed for the generation time period of the pulse a, and as illustrated in FIG. 5(c) the pulse b can be developed after the generation of the pulse a so as to take an overlapping time period.

Figure 6:
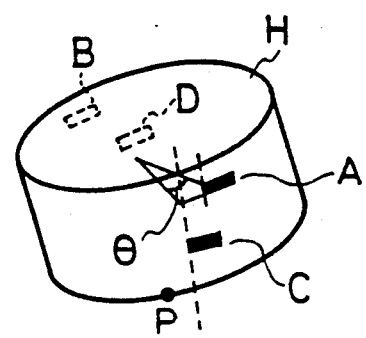
FIG. 6 is an illustration of an appearance of a video head into which this invention is incorporated.
Figure 7:
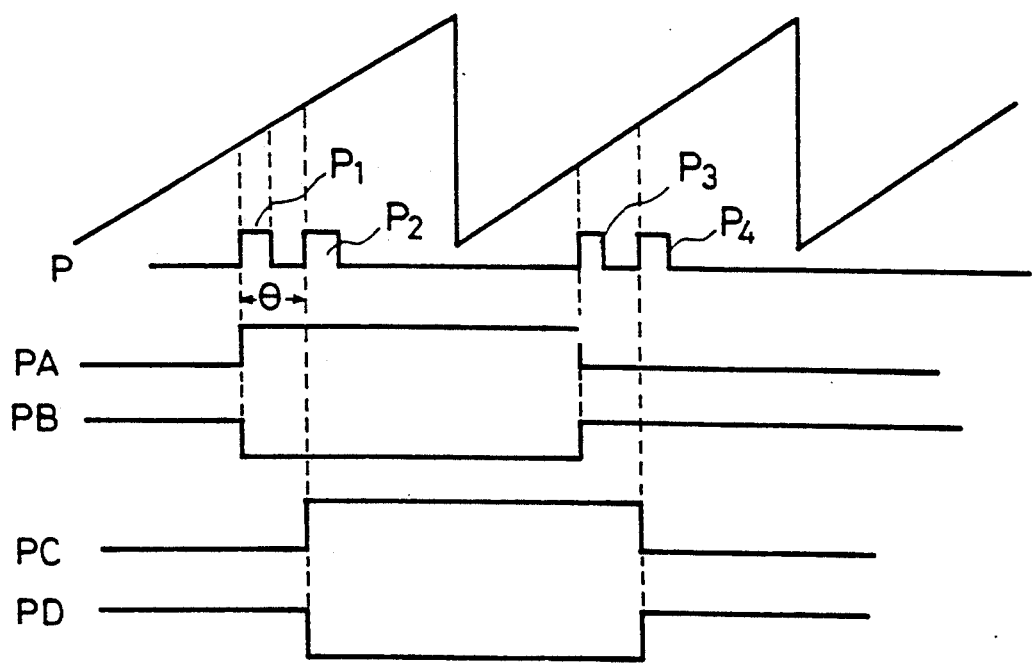
FIG. 7 is an illustration of a generation pulse and a control pulse for the FIG. 6 video head.
Figure 8:
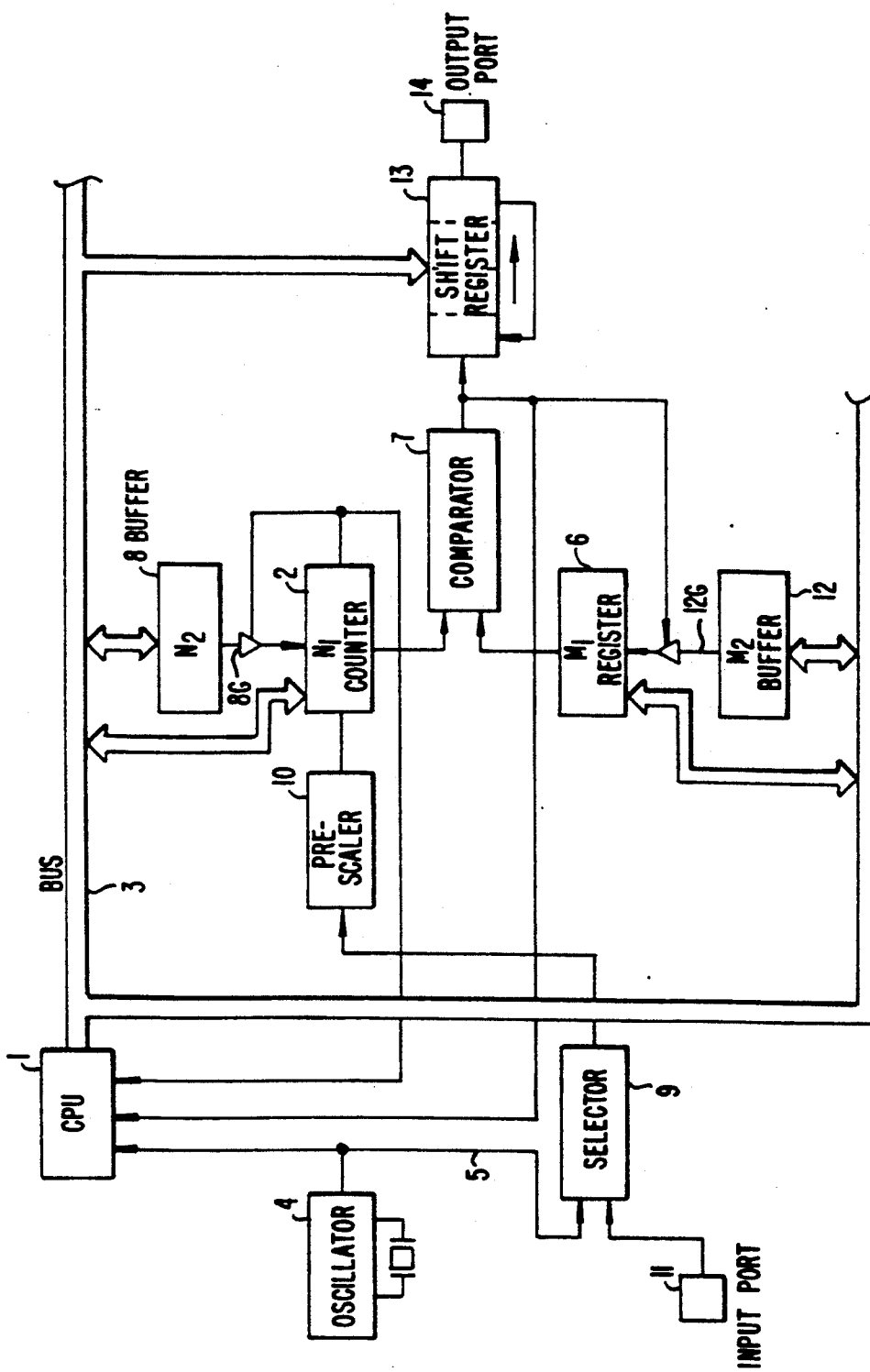
FIG. 8 is an illustration of a conventional pulse generating circuit.
Figure 9:
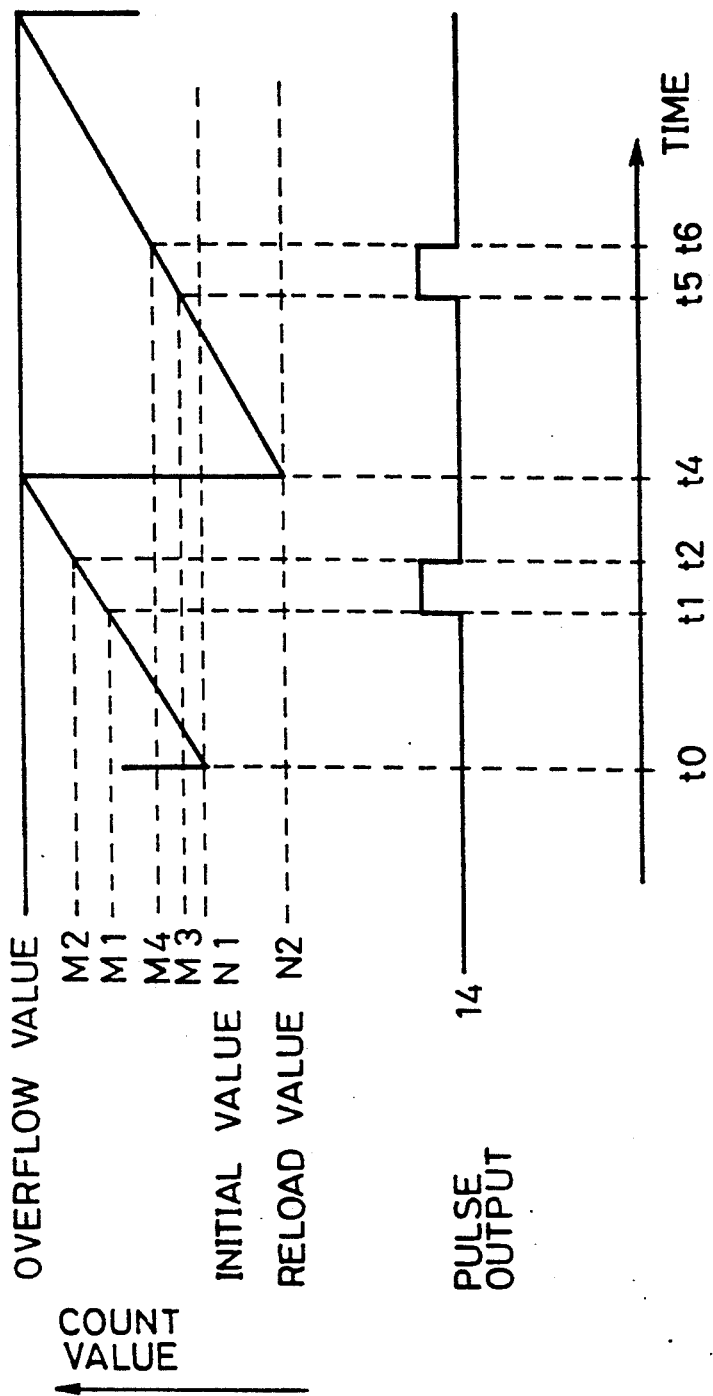
FIG. 9 is a timing chart showing the operation of the conventional circuit.

In addition, as shown in FIGS. 6 and 7, the pulse generating circuit according to this invention can be employed for a VTR head. That is, in a double-head H, there are provided a first video head A and a first audio head B, which are in confronting relation to each other, and a second video head C and a second audio head D, which are in confronting relation to each other with an angle $\theta$ being delayed. This is effective in the case that a pulse PA and the inversion output PB thereof are generated by using an terminal signal $P_1$ as illustrated in FIG. 7 so as to activate the first video head A and the audio head B to output an output terminal signal $P_2$ after being delayed by an angle $\theta$ (converting $\theta$ into a time) whereby a pulse PC and an inversion output PD are generated so as to activate the second video head C and the audio head D. Such a pulse may be employed for the television interlaced scanning operation.

Moreover, although the description of the above-described embodiment has been made in the case that the counter buffer and the two kinds of register buffers are respectively arranged to have one-step structure, it is also appropriate to arrange them to have a multi-step structure. This also can provide the same effect.

As described above, according to this invention there are provided a port latch having a plurality of output terminals, a data register for storing the data to designate an output terminal to generate an output pulse and the data to define the output state of the output terminal, and a decoder circuit for decoding the contents of the data register to output a decoded signal to the port latch in synchronism with the coincidence signal, whereby it is possible to obtain a pulse generating circuit which is capable of outputting pulses to a plurality of output terminals. This pulse generating circuit can be reduced in size as compared with the case that the conventional pulse generating circuit is arranged to have a plurality of output terminals, thereby allowing the size-reduction of a chip when incorporating it into an integrated circuit.

What is claimed is:

1. A pulse generating circuit comprising:
   counter means for counting a clock signal from an external circuit so as to be reset when the count value reaches a predetermined value;
   first register means for storing comparison value data to define a timing of a pulse generation;
   comparator means for detecting a coincidence between the count value of said counter means and the data of said register means to output a coincidence signal in response to the detection;
   second data register means for updating the contents of said first-data register means, said second data register means performing the updating operation in response to the coincidence signal from said comparator means;
   port latch means having a plurality of output terminals for generating output pulses in accordance with a designation made by an external circuit;
   data register means for storing data to designate the output terminal where the output pulse is to be generated and further for storing data to define an output state of the output terminal; and
   decoder means for decoding the contents of said data register means to output a decoded signal to said port latch means in synchronism with said coincidence signal outputted by said comparator means.

2. A program control digital pulse generator comprising:
   counter means for counting a clock so as to be reset when the count value reaches a predetermined value;
   register means for storing comparison value data to define timing of pulse generation;
   comparator means for detecting coincidence between the count value of said counter means and the data of said register means to output a coincidence signal;
   port latch means having a plurality of output terminals for outputting at least a binary state signal;
   data register means for storing data to specify an output terminal out of said plurality of output terminals to said port latch and further for storing data which defines the binary state of the output terminal; and
   a decoding circuit for deciding the contents of said data register means to output a decided signal to said port latch means in synchronism with said coincidence signal.

3. The program control digital pulse generator according to claim 2 further comprising:
   a register buffer for updating the contents of said data register in response to said coincidence signal.

* * * * *